United States Patent [19]

Moskovits et al.

[11] Patent Number: 5,581,091
[45] Date of Patent: Dec. 3, 1996

[54] NANOELECTRIC DEVICES

[76] Inventors: Martin Moskovits, 145 Chiltern Hill Road, Toronto, Ontario, Canada, M6C 3C3; Jing M. Xu, Dept. of Electrical & Computer Engineering University of Toronto 10 Kings College Road, Toronto, Ontario, Canada, M5S 1A4

[21] Appl. No.: 352,151

[22] Filed: Dec. 1, 1994

[51] Int. Cl.$^6$ .......................... H01L 29/06; H01L 21/302
[52] U.S. Cl. .................. 257/9; 257/30; 257/49; 257/594; 257/622; 257/773; 437/71; 437/188; 437/203; 437/205
[58] Field of Search ........................ 257/9, 30, 49, 257/594, 622, 773; 437/71, 188, 203, 205

[56] References Cited

U.S. PATENT DOCUMENTS

| | | | |
|---|---|---|---|
| 4,472,533 | 9/1984 | Moskovits | 502/320 |
| 5,420,746 | 5/1995 | Smith | 257/9 |
| 5,475,341 | 12/1995 | Reed | 257/40 |

OTHER PUBLICATIONS

"Single Electronics", Scientific American, Jun. 1992, Likharev pp. 80–85.
1993 International Semiconductor Device Research Symposium Dec. 1–3, 1993, Virginia vol. 1, 311–312a, Mawlawi et al.

*Primary Examiner*—Edward Wojciechowicz
*Attorney, Agent, or Firm*—Ridout & Maybee

[57] ABSTRACT

Single-electron devices useful as diodes, transistors or other electronic components are prepared by anodizing a metal substrate in sheet or foil form electrolytically in an acid bath, to deposit thereon an oxide film having axially disposed micropores of substantially uniform diameter in the range of from about 1 to about 500 nanometers and substantially uniform depth less than the thickness of the oxide film, leaving an ultra thin oxide layer between the bottom of each pore in the metal substrate. The conductive material is deposited in the pores to form nanowires contacting the oxide layer at the bottom of the pores. Macro metal is deposited over the ends of the nanowires for external electrical contact purposes. Devices can be made according to the present invention which are suitable to exhibit single-electron tunnelling effects and arrays of tunnel junction devices can be prepared having a density up to the order of $10^{10}$ per square cm.

6 Claims, 2 Drawing Sheets

NANOELECTRIC DEVICES

FIELD OF THE INVENTION

This invention relates to single-electronics. More specifically, it relates to single-electron devices useful as diodes and transistors or as other electronic devices, and to chemical processes for their preparation.

BACKGROUND OF THE INVENTION

A single-electron device, as the term is generally understood, is a device which controls the movement of individual electrons in solids. They commonly take the form of tunnel junctions, consisting of two conductors separated by an ultrathin (less than 100 nanometers) layer of insulating material. When a voltage is applied across the tunnel junction, inducing current (electron movement) to flow in the conductors, a surface charge accumulates on one surface of the conductor against the insulating layer, with an equal and opposite charge on the other insulator/conductor surface. When this surface charge exceeds a predetermined value, an electron tunnels through the insulating layer, thereby reducing the surface charge. When the surface charge is less than the predetermined value, tunnelling is suppressed (the Coulomb blockade). As a surface charge increases due to continued current flow in the conductor, i.e. continued application of the voltage across the insulator, the charge increases again, until the Coulomb blockade is overcome, whereupon another single electron tunnels through. The phenomenon can be observed experimentally, as a fundamental relation between applied voltage and the frequency of oscillation in the current flowing through the junction. The height of the Coulomb blockade depends upon the conductance and capacitance of the insulating layer.

A general description of single electronics and single-electron devices and their method of operation appears in "Scientific American", June 1992, page 80, in an article by Likharev and Claeson.

These single-electron phenomena show promise for application to digital integrated circuits. Currently computer chips can have a density of about ten million devices per square centimeter, to handle the commonly used digital electrical pulses. Using single electronics, even further reductions in size are possible, since bits of information can be represented through the passage of individual electrons. For this to happen, however, techniques need to be developed to fabricate complex structures whose smallest dimension is, controllably and reproducibly, less than 100 nanometers. Such techniques also need to be capable of operation economically and efficiently, for the production of single-electronic devices incorporating one or more such tunnel junctions.

SUMMARY OF THE INVENTION

It is an object of the present invention to provide novel, single-electron devices.

It is a further object of the invention to provide novel processes for making single-electron devices.

In the present invention, single-electron devices are made by a technique of electro deposition. A layer of porous oxide is deposited on the surface of a conductive substrate of a metal selected from aluminum, titanium, niobium and tantalum, by electrolytic anodizing. The pores formed in the oxide layer are of extremely small but very uniform shape, diameter and depth, controllable within close limits by the conditions of anodizing and/or by subsequent chemical etching. These highly uniform, nanometer-sized, densely packed pores are used in the present invention as templates, for the formation therein of conducting or semiconducting materials, to form an active region ("nanowire") of a tunnel junction device. The insulating layer or layers of the device can be formed by oxidation or other chemical conversion of the or each end portion of the, nanowire. Alternatively, the residual oxide layer at the bottom of each pore, separating the pore from the electrically conducting metal substrate, can form an insulating layer, with the metal substrate itself acting as the second conductor separated by this insulating oxide layer from the nanowire which is formed in the pore.

The invention thus takes advantage of the very small but highly uniform and controllable sizes of the pores formed in the oxide layer, by anodizing and if desired by subsequent chemical etching, to make single-electron devices. The pore sizes can be controlled to a diameter of about 90 Angstroms up to several thousand Angstroms, and to a height of several hundred Angstroms to several thousand Angstroms, to give devices with an array of conductor-barrier arrangements of dimensions suitable to exhibit single-electron tunnelling effects. Moreover, the pores and hence the nanowires formed in them can be extremely densely packed, allowing the preparation of arrays of tunnel junction devices, of a density up to the order of $10^{10}$ per square centimeter.

BRIEF REFERENCE OF THE DRAWINGS

DESCRIPTION OF THE PREFERRED EMBODIMENTS

Figure 1:
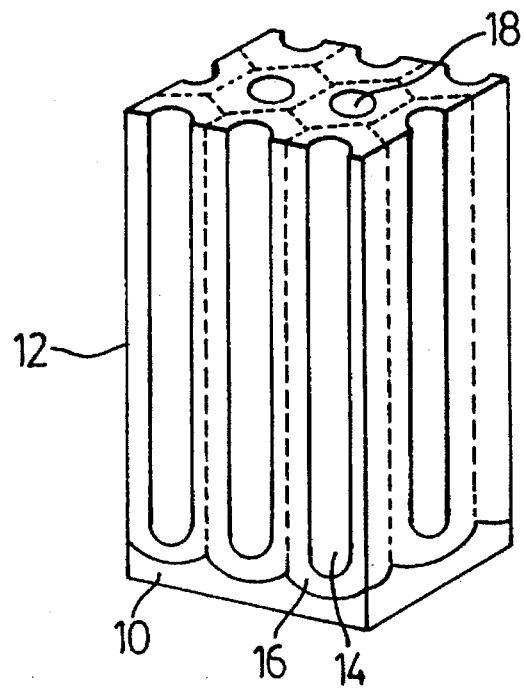
FIG. 1 is an idealized illustration of a pores template formed as a part of the process of the invention.

Devices according the present invention can take a variety of different forms, and incorporate one or more insulating barrier layers and correspondingly two or more conductors, at least one of which is a nanowire. The conductive metal substrate may constitute a conductor of the finally produced single-electron device, in which case the metal substrate is chosen from among aluminum, titanium, niobium, tantalum and alloys thereof on the basis of desired electrical properties. In other embodiments, the conductive metal substrate may be fully removed and replaced during the manufacturing process, and not constitute any part of the final device. In such cases, the initial choice of substrate is dictated by cost and by ease of manufacture, and is preferably aluminum.

Similarly, the insulating metal oxide formed initially on the conductive metal substrate may or may not form one or more of the insulating barrier layers in the final device. This will influence the choice of metal substrate, for similar reasons.

The simplest device according to the present invention, and the device most easily prepared (although not the most preferred embodiment) is one which has a single insulating layer (barrier) comprised of the oxide of the metal substrate, disposed between the metal substrate constituting one conductor, and a nanowire conductor formed in a pore in the oxide layer. Such a device is prepared by cleaning and anodizing the metal substrate, under carefully controlled conditions to provide thereon oxide film with the dense array of uniformly sized pores, the depth of the pores being controlled to leave a suitably thin oxide layer between the pore and the substrate to act as an insulating layer of a single-electron device. Metal, semi-conductor or other conducting material is subsequently deposited in the pores of the oxide layer, to contact the insulating oxide layer. A thin metal film (also referred to macrometal), for electrical connection purposes, is deposited over the nanowire in the pores, and in electrical contact therewith.

Other single-barrier devices according to the invention can be prepared by the process outlined above, followed by a removal and replacement of one or both of the metal substrate and the residual oxide separating the metal substrate from the pore. This can be effected chemically, by known metal and metal oxide removing techniques, chemical etching. After removal of only the metal substrate, another metal can be deposited over the metal oxide insulating barrier layer. After removal of both the metal substrate and the metal oxide insulating barrier layer, another insulating barrier layer can be deposited on one end of the nanowire, e.g. by controlled oxidation or other chemical treatment thereof. Then another conductor, e.g. metal, can be deposited over the newly formed barrier layer, to complete the single barrier device according to the invention.

Double barrier devices according to the invention can be prepared by depositing or oxidizing an insulating barrier layer on the end of the nanowire remote from the metal substrate, followed by deposition of another conductor over this insulating barrier layer, in the case where the original substrate and intervening oxide layer below the pores are left intact to constitute one barrier layer and conductor. In the case where the original substrate and the intervening oxide layer below the pores are both removed, double barrier devices according to the invention can be prepared after their removal, by deposition onto, or oxidation of, both ends of the residual nanowire of the insulating barrier layer, e.g. an oxide layer, followed by deposition thereover of conductive layers, e.g. of metal.

In order to constitute single electron devices, the embodiments of this invention only need to include one nanowire, and in all embodiments the pores formed in the oxide layers formed on the metal substrates provide the templates for these nanowires. Then one or two barrier layers can be deposited, of a size suitable for exhibiting single electron tunnelling effects, on account of the extremely small sizes of these nanowires, particularly their end surface areas. The uniformity and density of the pores allows the preparation of useful devices with practical applications.

A further, preferred embodiment of the invention is a multiple barrier device having a thin conductive intermediate layer, to which electrical connections can readily be made. This is prepared by initially providing an electrically conductive metal substrate of one of the aforementioned metals, e.g. aluminum, and providing a microporous oxide coating as previously described, on both sides. If desired, the substrate in this embodiment can comprise a conductive core, chosen on the basis of its electrical characteristics for a suitable application, carrying a deposit on both sides of one of the aforementioned metals, e.g. aluminum, this metal layer having a micro porous oxide coating as previously described. Metal can then be deposited in the pores to form nanowires, separated from the metal substrate by residual oxide forming the insulating barrier, on each side, thereby providing a double barrier device. A thin metal film can then be applied over the nanowires at their ends remote from the substrate, for electrical contact purposes, thereby providing a double barrier, three contact device comprising a very large array of nanowire-barrier "pathways", operable in the manner of a transistor.

This embodiment of the invention, utilizing a two sided porous substrate, can be further expanded from a two-barrier device to a three-barrier device or a four-barrier device, if desired, by creation of another barrier layer, e.g. by controlled oxidation, on the distal end of one or both of the sets of nanowires protruding from each side of the substrate. In such cases, the metal film is applied over the or each of the barrier layer, to provide electrical contact means.

The metallic substrate used in the process of the present invention, and in one embodiment serving as the conductor contacting the insulating layer, is normally aluminum or an aluminum alloy in which aluminum is the predominant metal, in foil or sheet form, or as a deposited aluminum film on an inert substrate. A surface layer of aluminum oxide is deposited thereon, to constitute the insulating layer, by anodizing the metal sheet or foil. Firstly, the sheet or foil should be cleaned, ultrasonically and/or with organic solvent to remove grease residues from its surface. Then it is preferably washed with an alkaline chemical liquid so as to achieve a degree of surface etching, followed by neutralization to remove alkali excess. A wide variety of different chemical reagents may be used for these purposes. Sodium carbonate solution is an example of a suitable base with which to effect the etching. Nitric acid is a suitable neutralizing agent for subsequent use. Thus, the preferred cleaning process is ultrasonic cleaning in dichloromethane, followed by treatment with dilute sodium carbonate and then with dilute nitric acid. However, the cleaning process can be conducted with a very wide variety of different reagents.

Electrolytic anodizing of the cleaned sheet or foil, for the purposes of depositing thereon a porous surface of oxide, is suitably accomplished by making the metal the anode of an electrolytic cell, using suitable (e.g. lead) counter-electrodes in an acid bath. Suitably, the bath is a relatively dilute solution of strong acids such as sulfuric acid, phosphoric acid, oxalic acid, or chromic acid. Direct current is passed through the cell between the electrodes, at a current or voltage suitably adjusted to provide the correct film deposition. This can be accomplished at room temperatures.

After suitable anodizing as described, the substrate is removed from the bath and rinsed. It is desirable to rid the surface of the treated substrate of residual acid, and neutralize it at this point. It is, however, undesirable to neutralize the acid chemically, since this might have the effect of damaging the deposited film. Accordingly, it is preferred to rinse the anodized film with suitable quantities of water to remove acid and effect appropriate neutralization.

A substrate so prepared has micro-pores in the oxide surface film, of substantially uniform size in the nanometer size range, and extending substantially perpendicularly from the substrate surface and therefore substantially parallel to one another. At the bottom of each such micropore is a very thin layer of aluminum oxide, an electrical insulating material, separating the body of the pore from the conducting metal aluminum or aluminum alloy substrate. By appropriate means according to the present invention, this pore structure is utilized to provide another conductor, separated from the conducting aluminum or aluminum alloy substrate, by a nanometer-size range thickness of insulating layer to form the principle of the single-electron devices according to the present invention.

In a next step, therefore, an appropriate conductor is applied to the interior of the pores. A typical example of such a conductor is nickel. Before or after deposition of the metal such as nickel into the pores, the height and size of the pores can be chemically adjusted, by chemical etching. The length of this "column" of deposited metal defined by the size of pore, is not critical, but is typically in the size range from 1–10 microns.

The diameter, the density and the height of the pores is determined to some extent by the choice of acid in the anodizing bath. Suitable acids from which to choose are phosphoric acid, oxalic acid, sulphuric acid and chromic acid. The use of phosphoric acid leads the formation of relatively large pores. The use of oxalic acid or chromic acid leads towards the formation of smaller pores, while the use of sulphuric acid leads the formation of pores of the smallest diameters. The relative concentration of the acid used also has a minor effect on the pore sizes produced, but this effect is of little significance in comparison with that derived from the choice of acid.

Pore density, i.e. the distance between individual pores in the substrate, can be further varied by choosing the DC anodizing voltage appropriately. High anodizing voltages lead to low pore densities, whilst low anodizing voltages tend towards the film with high poor densities. The anodizing voltage has a lesser effect on the individual pore sizes.

After the anodizing process has been completed, the diameters and the depths of the pores can be further adjusted by etching the oxide film with an appropriate acid medium. As noted above, this can be done before or after deposition of metal into the pores. This acid etching thus makes the final adjustment in the thickness of the oxide layer which eventually separates the metal substrate from the deposited conductor metal in the pore.

The acid chosen for etching purposes, to remove controlled amounts of the oxide film, can be selected from the same group of acids as chosen in respect of the anodizing bath.

Deposition of metal or other conductor into the uniform pores to form the nanowires is suitably accomplished by immersing the previously anodized aluminum surface into an appropriate electrolyte containing the desired metal in anionic form, then applying alternating current between the aluminum and a suitable counter electrode such as graphite. The metallic particles eventually formed are faithful replicas of the interiors of the pores in the metallic oxide layer. There do not appear to be any surface effects, inhibiting a true filling of the pores to the lower and side extremities thereof with the deposited metal. Individual metallic deposits are initially formed within the pores, and grow from the bottom of the pores upwardly and outwardly. The deposits eventually coalesce into compact metal rods, posts or cylinders, i.e. nanowires. The length of the nanowires depends on the duration of the AC electrolysis process, among other parameters.

In one embodiment of the present invention, after the template has been etched back to expose the tips of the nanowires, the tips of the nanowires are oxidized at their ends remote from the aluminum substrate, to form insulating electrical barrier layers thereon. The oxidation is conducted carefully, in a controlled manner, so that an insulating, oxide layer of extremely thin but constant thickness is formed. On top of this oxide layer there is deposited a further conductor such as a metal (e.g. gold) so that a double-barrier device is created, having 2 insulating layers through which single-electron tunnelling can occur upon application of suitable voltage, in large number arrays. The uniformity of the pores initially formed in the aluminum oxide on the substrate allows for the high degree of uniformity of metal deposited in such pores, which in turns allows for the high degree of uniformity of the oxide deposited on top of the metal, as the second very thin insulating layer.

For preparing an insulating barrier layer on the end of a nanowire, formed in the pores of the oxide as described above, a process of oxidation can be conducted in order to form an oxide insulating barrier layer. This can be done in the presence or absence of the initial metal substrate. Oxidation of metals is a simple, well controlled process, which can be conducted by heating the metal in the presence of oxygen, e.g. in an oven or under a heat lamp. The temperature to which the metal is heated, the time of exposure to oxygen and the nature of the atmosphere determine the depth of formation of the insulating oxide layer on the end of the nanowire, and is readily and easily controllable, since the oxidation is generally a slow process. Normally, barrier layers of a thickness of from about 10 to 1,000 Angstroms, most preferably from 10 to 100 Angstroms are formed. The best thickness depends to some extent upon the nature of the oxide material, e.g. on its dielectric constant and bandgap. The higher the dielectric constant, the thinner the oxide layer needs to be.

Instead of oxide formation to provide these barrier layers, other methods can be adopted, provided that they are controllable to give appropriate thicknesses of layers. Thus, insulating or semiconducting materials can be applied by solution deposition, for example when a polymeric insulating material is chosen. Deposition can also be conducted by vapour deposition by chemical means, sputtering or direct vapourization, all of which processes are capable of exact thickness control. When the initial aluminum substrate and residual oxide has been removed, so that it is required to provide a new barrier layer on both ends of the nanowire, these can be provided simultaneously, especially in cases where the same insulating material to substantially the same thickness is being applied to both ends, or sequentially in the case where different insulating materials are being applied to each end.

Any such insulating barrier layer provided on a device according to the invention is overlayed by a conducting layer, preferably a metal layer, to which external electrical contact is made. In the case where the aluminum substrate remains in place as one of the external connecting conductors, only the distal end of the nanowire carrying the insulating barrier layer needs to be provided with a metal deposit. Suitable methods for applying metal over the insulating barrier layers are known in the art, and include electrical chemical methods, sputtering and other metal vapour deposition techniques. In the case where the initial aluminum substrate and its associated oxide layer have been removed, it is usual but not necessary to apply the same metal to both ends of the nanowire, by one or other of these techniques, depending upon the electrical characteristics desired in the final product.

Reference has been made above to embodiments in which the initial substrate material, normally aluminum is removed from the device, and replaced by another metal for electrical connection purposes. This can be performed by chemical methods, e.g. by etching with appropriate acids under carefully controlled conditions. By suitable choice of chemicals, within the skill of the art, the metal substrate can be etched away, and subsequently if desired, the residual metal oxide on the end of the nanowires can be etched away also, for replacement with another chosen barrier material. In this way, the metal material for use as the conductor, and the barrier material, can be chosen from a wide range of different materials selected on the basis of their electrical characteristics for use in the chosen application.

A wide range of metals is available to form the nanowires in the pores of the oxide insulating layer, according to the present invention. The basic criteria for its selection are that it must be a good electrical conductor, and that it must be depositable in the pores of the oxide layer by practical, acceptable means. It is also preferred that any chosen metal should be one which can readily and controllably be converted to an electrically insulating, or at least less electrically conducting, compound thereof, by relatively simple chemical means such as controlled oxidation. Examples of suitable such preferred metals are nickel, cadmium, bismuth, iron, titanium, niobium, silver, gold, and platinum.

SPECIFIC DESCRIPTION OF THE MOST PREFERRED EMBODIMENTS

FIG. 1 of the accompanying drawings illustrates diagrammatically the nature of the pores template formed in anodic aluminum oxide, electrically chemically oxidized in an acid electrolyte. Residual aluminum substrate 10 has a layer of oxide 12 thereon, with uniform, parallel pores 14 extending therethrough, substantially perpendicularly to the plane of the residual aluminum layer. A portion 16 of the aluminum oxide layer separates each pore from the aluminum substrate layer 10. Each of the pores 14 is open at its distal end 18, remote from the aluminum substrate layer 10. By tuning the key parameters of the electrochemical oxidation process—voltage, temperature, acid electrolyte and time, one can obtain pores of any length up to several microns and any diameter between about 10 and 200 nanometers (100 and 2000 Angstroms).

In the next stage of the process according to the invention, metal is electrochemically deposited into the pores by transferring the pre-anodized aluminum to an appropriate electrolyte followed by AC electrolysis. As electro deposition continues, metal fills the pore from the bottom upward. This forms nanowires in the pores.

Figure 2:
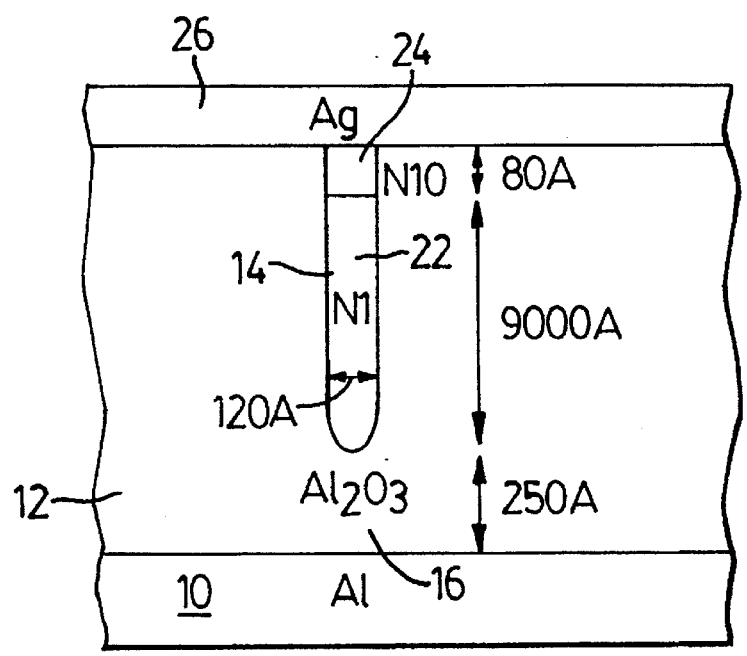
FIG. 2 is a schematic view of a cross section of a nickel nanowire prepared and studied in the present invention.

FIG. 2 is a schematic view of the cross section of such a nanowire made by depositing nickel into the pores 14 of the aluminum oxide layer 12 generally illustrated in FIG. 1. The wires 22 are separated from the bottom most aluminum substrate 10, which provides an electrical contact, by an aluminum oxide thickness of insulating barrier 16 of about 250 Angstroms. By a process of controlled oxidation, a nickel oxide insulating layer 24 has been provided on the topmost portion of the nickel nanowire 22, and by electro deposition, a layer of silver metal 26 has been applied over the nickel oxide layer 24, so that the silver layer and the aluminum substrate provide electrical contacts, separated by a double barrier device formed of the nickel nanowire 22, the aluminum oxide barrier portion 16 and the nickel oxide barrier portion 24. The thickness of the nickel oxide layer 24 is about 80 Angstroms. The nickel wire 22 is about 120 Angstroms in diameter, and about 9,000 Angstroms in length. The electrical performance of this device, and further detail of its preparation, are described below in Example 1.

Figure 3:
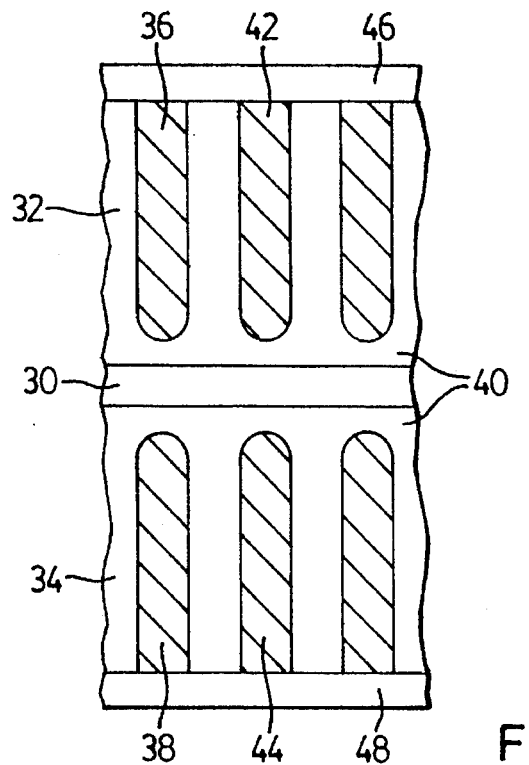
FIG. 3 is a diagrammatic cross section of an alternative and preferred embodiment of the present invention.

FIG. 3 of the accompanying drawings illustrates diagrammatically in cross section a different, preferred embodiment of the present invention, comprising an aluminum substrate 30 having porous oxide layers 32,34 on each side thereof. The pores 36,38 therein extend close to the aluminum substrate 30 but there is provided a barrier 40 of insulating aluminum oxide residue, between the pores and the aluminum substrate. Metal e.g. nickel has been deposited into the pores, to form nanowires 42,44 extending away from the aluminum substrate. A metal, e.g. silver has been electro deposited over the distal ends of the respective sets of nanowires to provide macromolecular metal contacts 46,48.

With the device illustrated in FIG. 3, electrical contact can be made to the aluminum substrate sheet 30, and to each of the peripheral metal layers 46,48. Thus, different signals and settings can be provided to the central substrate 30. Conductivity through this substrate between metal layers 46 and 48 depends upon single electron tunnelling through the insulating barriers of oxide at each side of the substrate sheet. Accordingly, the device shown in FIG. 3 can be operated in the manner of a transistor and as such incorporated into electronic circuits, e.g. for digital purposes.

The invention is further described, for illustrative purposes, in the following specific examples.

EXAMPLE 1

To prepare single-electron devices by the process of the present invention, a super purity (99.99%) Aluminum sheet, after being degreased in trichloroethylene, was used as the substrate, and anodized at 20V using a 0.5M sulfuric acid electrolyte and a high purity lead foil cathodes.

The sample was then rinsed in distilled water and then immersed in an aqueous electrolyte consisting of 120 g/l nickel sulfate and 45 g/l boric acid. The nickel metal was deposited into the pores by A.C electrolysis at 23° C., at 200 Hz and 16 V rms using graphite counter-electrodes to form the nanowires.

The alumina film was then etched to expose the tips of the nickel wires, in a solution consisting of 0.5M phosphoric acid and 0.2M chromic acid at 80° C. for a period of time varying from 30–120 seconds. For some samples, to create a parallel array of equal length wires, the exposed tips were then polished off with gamma micropolish alumina (0.05). The samples were then left at room temperature for 48 hours in order to allow the formation of a nickel oxide tunnel barrier on the end of the nickel wire. After allowing the oxidation to take place, the samples were sonicated for two minutes in ethanol, air dried, then transferred to a vacuum chamber where silver pellets were evaporated and then deposited on the surface to form a contact.

Samples as prepared above provided nanowires separated from the bottom Al contact by an aluminum oxide layer of about 250 Angstroms thickness, and from the top silver contact by a nickel oxide layer of about 80 Angstroms thickness. The wires were about 120 Angstroms in diameter, about 9000 A in length, and about $10^{10}$ per sq. cm in area density. By controlling key parameters such as the oxidizing medium, post-anodizing etch time, the time for A.C.>deposition, temperature, and concentrations of electrolytes one can obtain pores filled with various materials with lengths up to several microns and any diameter between ~10 and ~200 nm. The standard deviations in the wire diameter can be controlled to below ~15% of the mean diameter.

EXAMPLE 2

Figure 4:
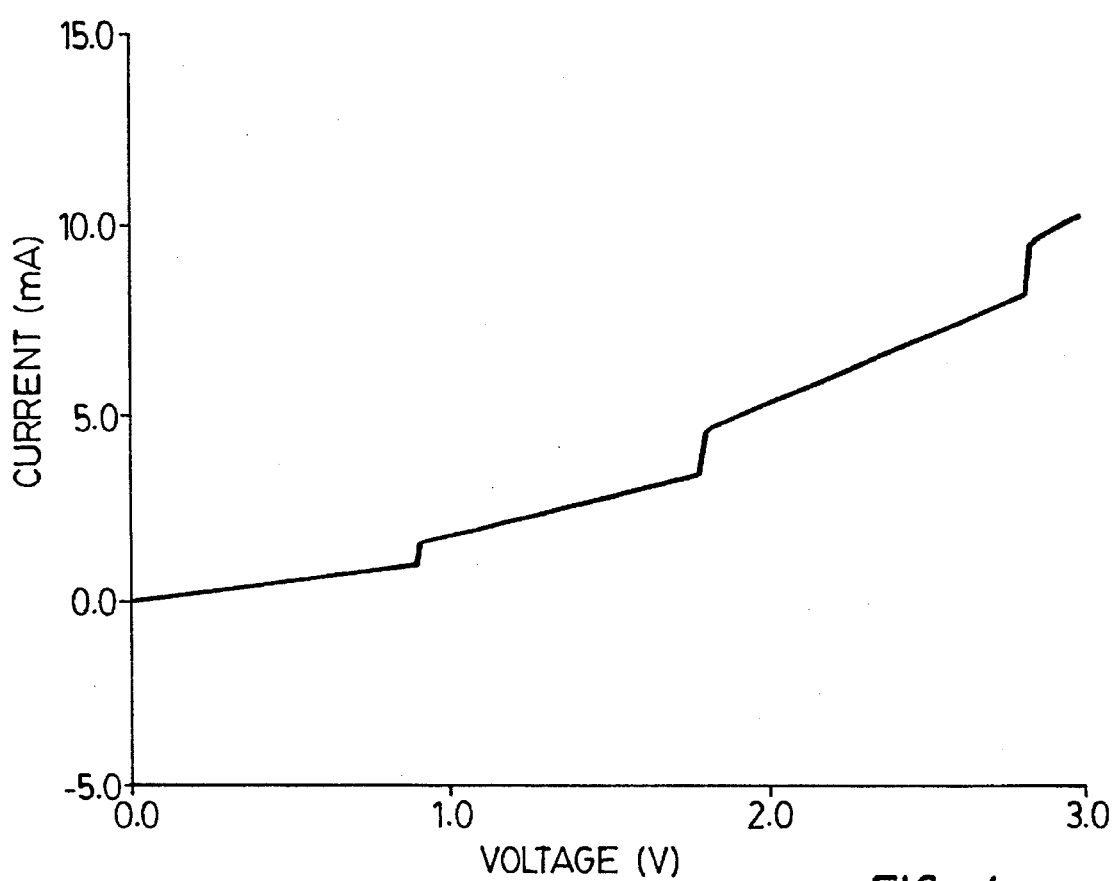
FIG. 4 is a voltage-current curve derived from devices according to the present invention as described in Example 2 below.

The samples were measured at room temperature, using both Keithley 237 and HP4145. Most samples were ~0.5 cm$^2$ with a nickel wire density of ~3×$10^{10}$ cm$^{-2}$. FIG. 4 of the accompanying drawings shows the current-voltage, typical of this family of samples.

The clearly observable stair-case like I–V characteristics on FIG. 4, the rather sharp rise edges of the stairs, the plateaus, and the very small current before the onset of the first step are reminiscent of single electron tunnelling in double-junction systems predicted by Coulomb blockade theory and observed in experiments at low temperatures.

The very small dimensions of the junctions are consistent with the possibility of observing room-temperature Coulomb blockade effects. The unusually large onset voltage of the first current step (~0.9V) and the large voltage intervals between steps are consistent with the predictions of the conventional theory if the geometrical and material parameters characteristic of these structures are used. The sharpness of the steps on FIG. 4 is also consistent with theory provided that there is a large difference in the resistances and capacitances of the two junctions.

Coulomb blockade theory predicts that the onset voltage of the first stair occurs at $V_1 \approx e/(2C_1)$, i.e. $V_1 \approx 1V$ when $C_1$ is of the order of $10^{-19}F$. Assuming that in the samples according to the invention the top (nickel oxide) barrier is a hemispherical cap with a tip diameter of ~10 nm, a thickness of ~8 nm and has a relative dielectric constant of ~4 its capacitance ($C_1$) would be approximately $5 \times 10^{-19}F$. A similar calculation for the bottom (aluminum oxide) junction assuming a thickness of ~25 nm and a dielectric constant of ~4.5 leads to a capacitance ($C_2$) of approximately $2 \times 10^{-19}F$. The dimensions used in the calculations are consistent with electron microscopy measurements. The estimated capacitance values are small enough to satisfy the inequality $$kT < \frac{e^2}{2C}, \quad c = \frac{C_1 C_2}{c_1 + C_2}$$

the prerequisite for observing single electron tunnelling at room temperature. With these values of capacitance the calculated onset voltage would be approximately 0.2V, which is of the same order of magnitude as the experimentally measured 0.85V.

It should be noted that for Coulomb blockade to be observed, the wires should be well isolated from the environment, i.e. the tunnelling resistance should be well above the quantum resistance $R_Q = e^2/h = 23.6$ k$\Omega$. This condition is satisfied for our samples.

It is to be noted that these results were obtained at room temperatures. At those temperatures, single electron events are rarely observable unless the energy change of the system associated with one electron crossing is much greater than $kT$. Structure parameters of the devices described herein give capacitances for the two junctions sufficiently low for this to occur. The capacitance values found are consistent with those required for the observed voltage differences between subsequent current jumps in a double-junction model. The system demonstrates Coulomb blockade effects.

What we claim is:

1. A process of preparing single-electron devices comprising an array of elements each comprising at least two conductors contacting and separated by an ultrathin insulating or semiconducting layer, at least one of the conductors of each element being a nanowire, said process comprising:

providing a metal substrate in sheet or foil form, the metal thereof being selected from aluminum, titanium, niobium, tantalum and alloys containing a predominant amount of one of said metals;

anodizing said substrate electrolytically in an acid bath, to deposit thereon an oxide film having micropores of substantially mutually parallel axial disposition and substantially uniform diameter in the range from about 1 to about 500 nanometers and substantially uniform depth which is less than the thickness of the oxide film, so as to leave an ultrathin oxide layer between the bottom of each pore and the metal substrate;

depositing in said pores a conductive material, to form a nanowire in contact with the oxide layer at the bottom of said pore;

and depositing macro metal over the ends of the nanowires so formed, for external electrical contact purposes.

2. The process of claim 1, including the additional step of forming an insulating layer over the end of each nanowire, interposed between the end of the nanowire and the macrometal.

3. The process of claim 2 wherein said additional step is accomplished by chemical conversion of the distal end portion of the nanowires.

4. Single-electron devices comprising an array of single-electron elements, each said element comprising:

at least one nanowire conductor having a first end and a second end;

first and second ultrathin semi-conductive or insulating layers overlying and electrically contacting the first and second ends respectively of the nanowire conductor;

first and second macro metal layers respectively overlying and electrically contacting the said ultrathin layers, for external electrical connection purposes.

5. Single-electron devices according to claim 4 wherein one of said macro metal layers is a metal sheet or foil provided with a microporous metal oxide film on at least one side thereof, the nanowire conductors being metal deposited in the micropores thereof, and the residual metal film constituting one of said ultrathin layers.

6. Single-electron devices according to claim 5, wherein said metal sheet or foil is provided with a microporous metal oxide film on both sides thereof, with nanowire conductors formed of metal deposited in pores of both such films.

\* \* \* \* \*